United States Patent [19]
Lee

[11] Patent Number: 5,927,991
[45] Date of Patent: Jul. 27, 1999

[54] METHOD FOR FORMING TRIPLE WELL IN SEMICONDUCTOR DEVICE

[75] Inventor: Sang-Don Lee, Cheongju, Rep. of Korea

[73] Assignee: LG Semicon Co., Ltd., Cheongju, Rep. of Korea

[21] Appl. No.: 08/772,289

[22] Filed: Dec. 23, 1996

[30] Foreign Application Priority Data

Dec. 30, 1995 [KR] Rep. of Korea ........................ 95/68661

[51] Int. Cl.⁶ .............................................. H01L 21/8238
[52] U.S. Cl. ........................ 438/228; 438/289; 438/451; 438/529
[58] Field of Search .................................... 438/217, 228, 438/289, 451, 529

[56] References Cited

U.S. PATENT DOCUMENTS

| | | | |
|---|---|---|---|
| 5,501,993 | 3/1996 | Borland | 438/228 |
| 5,608,253 | 3/1997 | Liu et al. | 257/365 |
| 5,693,505 | 12/1997 | Kobayashi | 438/217 |
| 5,753,956 | 5/1998 | Honeycutt et al. | 257/372 |
| 5,814,866 | 9/1998 | Borland | 257/369 |
| 5,821,589 | 10/1998 | Borland | 257/369 |

OTHER PUBLICATIONS

Borland, John O., "Applications of M V Ion Implantation in Semiconductor Device Manufacturing," Semicon/Korea '95, Technical Symposium, Jan. 19–20, 1995, pp. 107–115.

*Primary Examiner*—John F. Niebling
*Assistant Examiner*—Christopher Lattin
*Attorney, Agent, or Firm*—Fleshner & Kim

[57] ABSTRACT

An improved method for forming a triple well of a semiconductor device which is capable of more simply and easily forming a triple well without removing an anti-oxidation film. In addition, it is possible to reduce the amount of the removal of the field oxidation film and to improve the characteristics of the latch-up and the device isolation, which includes the steps of preparing a first conductive type semiconductor substrate having an active region and a field region, forming a buffer film on the active region of the substrate and an anti-oxidation film on the buffer film, forming a field oxidation film on the field region, forming a second conductive type first dopant region on the substrate by implantating a first ion through the field oxidation film and the anti-oxidation film, forming a first conductive type first dopant region by implantating a second ion in a first well region of the substrate, forming a first conductive type second dopant region by implantating a third ion in a second well region of the substrate, which the second well region is spaced apart from the first well region, and forming a second conductive type second dopant region by implantating a fourth ion in a third well region of the substrate between the first well region and the second well region.

8 Claims, 3 Drawing Sheets

METHOD FOR FORMING TRIPLE WELL IN SEMICONDUCTOR DEVICE

BACKGROUND OF THE INVENTION

1. Field of the Invention

The present invention relates to a method for forming a triple well in a semiconductor device, and particularly to an improved method for forming a triple well in a semiconductor device which is capable of reducing a soft error rate, and improving a latch-up characteristic and a device isolation characteristic by forming a well through an ion implantation process without removing a nitride film after a field oxidation process of a semiconductor substrate.

2. Description of the Conventional Art

FIGS. 1A through 1D show vertical cross-sectional views of a semiconductor device having an MeV triple well structure formed using four masks. In this regard, description was given in SEMICON/Korea '95 Technical Symposium, page 112. As shown in FIG. 1A, a field oxidation film 2 is formed in a field region on a semiconductor substrate 1. A nitride film and a pad oxidation film are removed in an active region except for the field oxidation film 2. A new pad oxidation film (not shown) is formed. As shown in FIG. 1B, an n-shield mask 3 is formed on the semiconductor substrate 1 on which the field oxidation film 2 and the pad oxidation film (not shown) are formed, and an n-shield ion implantation layer 3a is formed in the semiconductor substrate 1 through an ion implantation using a high energy level. As shown in FIGS. 1C and 1D, an n-well and p-well masks 4 and 5 are formed on the semiconductor substrate 1, and a triple well is formed in the substrate 1 through the n-well and p-well ion implantation process, a channel stop ion implantation processes, and a threshold voltage adjusting ion implantation process.

Namely, in the conventional art, the field oxidation film 2 is formed on the semiconductor substrate 1 by a local oxidation of silicon (LOCOS) method. Thereafter, a new pad oxidation film is formed, and a high energy ion implantation process is performed so as to improve the characteristics of the soft error rate and latch-up, and a medium energy ion implantation process is performed so as to improve punch-through stop and device isolation characteristics, and then an n-well and p-well are formed. In addition, the threshold voltage adjusting ion implantation process is performed so as to satisfy the characteristics of the MOSFET device, and then a triple well is formed in the semiconductor substrate.

In accordance with the above-described triple well formation method of a semiconductor device, since the ion implantation process is performed using the n-well and p-well asks after removing the nitride film after the field oxidation process, the dopant which is inserted so as to improve the device isolation characteristic, as shown in FIGS. 1C and 1D, is formed at the bottom portion of the field oxidation film based on the shape of the field oxidation film. Namely, since the dopant is not formed at the edge portion of the field oxidation film, the device isolation characteristic is degraded.

In addition, when removing the nitride film after the field oxidation process and performing certain processes for forming an n-well and a p-well, since additional processes for removing the pad oxidation film and the new oxidation film are performed, the field oxidation film may be removed during the processes of removing the pad oxidation film and the newly formed oxidation film before the growth of a gate oxidation film, thus degrading the device isolation characteristic.

SUMMARY OF THE INVENTION

Accordingly, it is an object of the present invention to provide a method for forming a triple well in a semiconductor device which overcomes the problems encountered in the conventional method.

It is another object of the present invention to provide an improved method for forming a triple well in a semiconductor device which is capable of more simply and easily forming a triple well without removing an anti-oxidation film, and which, in addition, makes it possible to reduce the removal amount of the field oxidation film and to improve the latch-up and the device isolation characteristics.

To achieve the above objects, there is provided a method for forming a triple well of a semiconductor device, which includes preparing a first conductive type semiconductor substrate having an active region and a field region, forming a buffer film on the active region of the substrate and forming an anti-oxidation film on the buffer film, forming a field oxidation film on the field region, forming a second conductive type first dopant region in the substrate by implanting first ions through the field oxidation film and the anti-oxidation film, forming a first conductive type first dopant region by implanting second ions in a first well region of the substrate, forming a first conductive type second dopant region by implanting third ions in a second well region of the substrate spaced apart from the first well region, and forming a second conductive type second dopant region by implanting fourth ions in a third well region of the substrate between the first well region and the second well region.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1A:
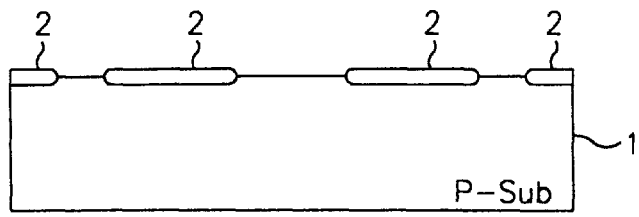
FIGS. 1A through 1D are vertical cross-sectional views showing a conventional well formation method of a semiconductor device.
Figure 1B:
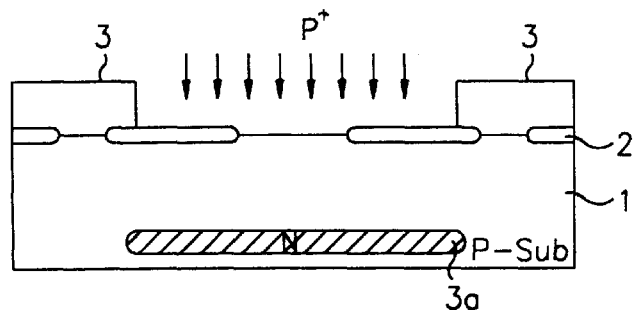
Figure 1C:
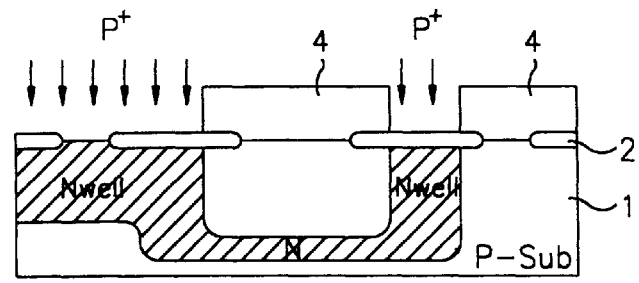
Figure 1D:
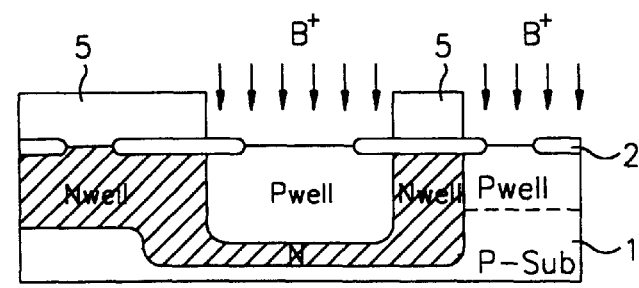
Figure 2A:
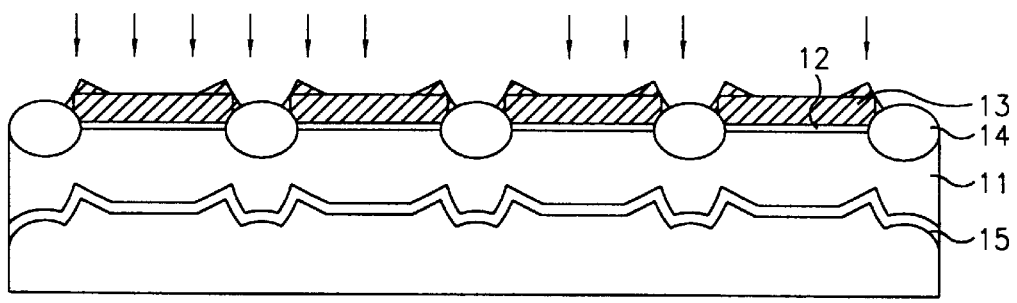
FIGS. 2A through 2E are vertical cross-sectional views showing a triple well formation method of a semiconductor device according to the present invention.

FIGS. 2A through 2E are vertical cross-sectional views showing a triple well formation method of a semiconductor device according to the present invention. As shown in FIG. 2A, pad oxidation film 12 which is a buffer film and a CVD nitride film 13 which is an anti-oxidation film are formed in order on a p-type silicon substrate 11. A photoresist film (not shown) is coated on the anti-oxidation film and is patterned. The anti-oxidation film and the buffer film of the field region of the semiconductor substrate 11 are removed through an etching process using the patterned photoresist film as a mask, and the photoresist film is stripped, and a field oxidation film 14 is formed by the LOCOS method.

Thereafter, in a state that the patterned anti-oxidation film formed in the active region of the semiconductor substrate 11 is present, an ion implantation process is performed with respect to the front surface of the substrate 11. Namely, in a state that the CVD nitride film 13 is present after the field oxidation process, a second conductive type, namely, an n-type first dopant region 15 is formed through an energy ion implantation without using the mask.

Figure 2B:
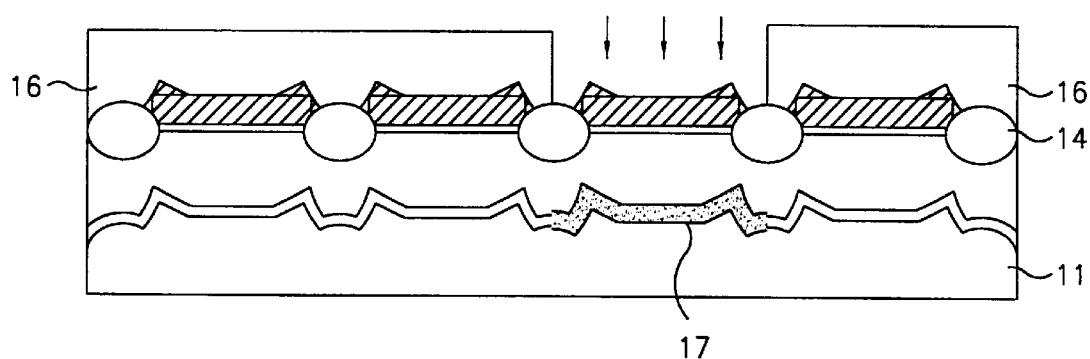

As shown in FIG. 2B, a photoresist film 16 is coated on the front surface of the semiconductor substrate 11, and a first well region is defined, and high energy ions are implantated using the patterned photoresist film 16 as a mask. Therefore, a first conductive type, namely, a p-type first dopant region 17 is formed in the semiconductor substrate 11. The photoresist film 16 is then removed.

The first conductive type first dopant region 17 is formed at the depth of the second conductive type first dopant region 15 in order for the p-wells to be connected to other elements through the first conductive substrate 11.

Figure 2C:
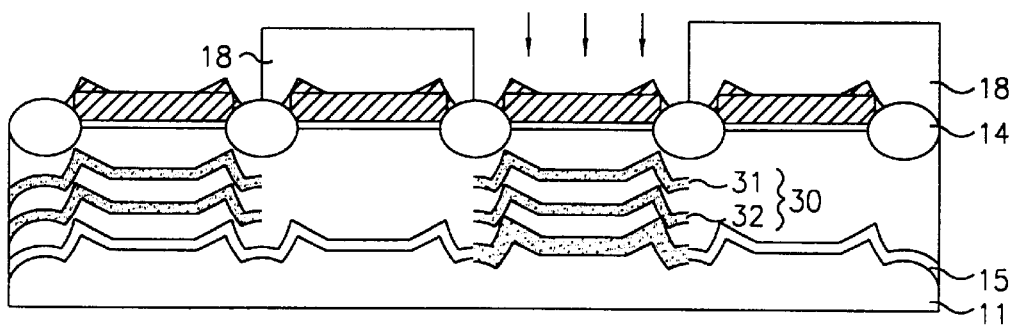

As shown in FIG. 2C, a photoresist film 18 is coated on the first conductive substrate 11 is coated and patterned, whereby first and second well regions are defined on the upper surface of the semiconductor substrate 11, and a first conductive type second dopant region 30 is formed by ion implantation using the patterned photoresist film 18 as a mask. A first conductive type second dopant region 30 is formed with a low energy ion implantation layer and a medium energy ion implantation layer which are formed by implanting ions of medium and low energies in order. The photoresist film 18 is then removed.

Figure 2D:
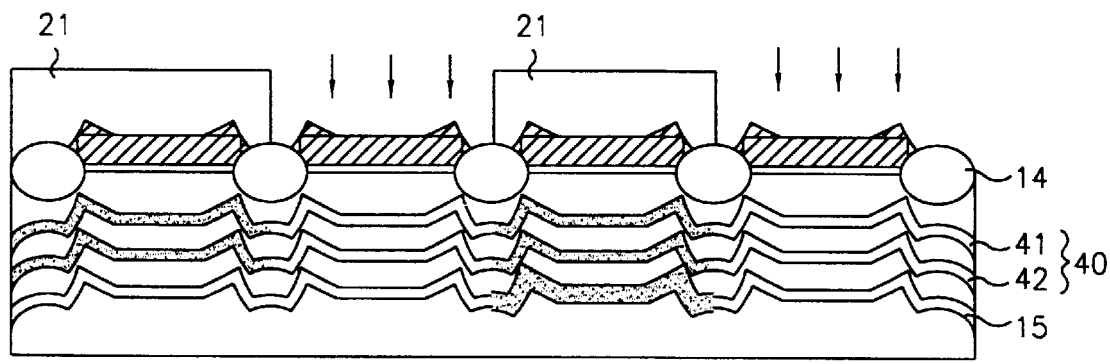

As shown in FIG. 2D, the photoresist film 21 is coated and patterned on the semiconductor substrate 11, thus defining a third well region. A second conductive type dopant region 40 is formed in the semiconductor substrate 11 through an ion implantation process using the patterned photoresist film 21 as a mask. The second conductive type second dopant region is formed with a low energy ion implantation layer 41 and a medium energy ion implantation layer 42 which are formed by implanting ions of medium and low energies in order. The photoresist film 21 is then removed.

Thereafter, the anti-oxidation film and the buffer film of the active region are removed, and the structure is annealed, thus forming a triple well in the semiconductor substrate 11.

The high energy ion implantation is performed within an energy range of 0.5–4.0 Mev, and the dopant concentration ranges between $10^{12}$–$10^{14}$, and the medium energy ion implantation is performed with an energy range of 0.1–4.0 MeV, and the dopant concentration ranges between $10^{12}$–$10^{14}$. In addition, the low energy ion implantation process is directed to adjust the energy level in accordance with the thickness of the field oxidation film. Here, the dopant concentration ranges between $10^{11}$–$10^{14}$.

As shown in FIGS. 2C and 2D, the first conductive type second dopant region 30 and the first conductive type second dopant region 40 may be formed through only time process of the ion implantation, and the medium and low energy ion implantations may be performed in order so as to form the regions 30 and 40.

The thickness of the anti-oxidation film serves to position the dopant at a desired position in the channel region when positioning the dopant at the bottom portion of the field oxidation film 14 through the low energy ion implantation process.

Figure 2E:
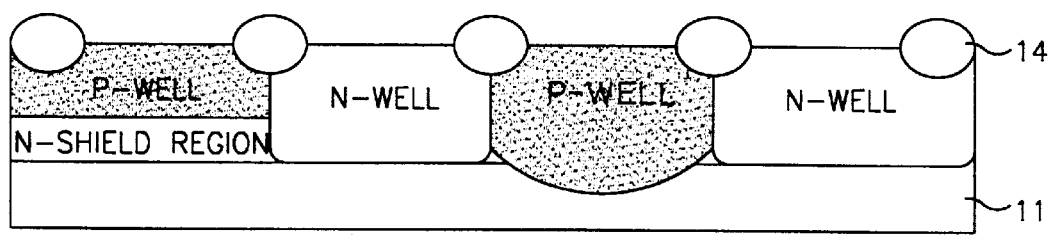

As shown in FIG. 2E, the upper surface of the semiconductor substrate 11 is etched, and the anti-oxidation film is removed, whereby the triple well formation is finished. A p-well is formed in the third well region of the semiconductor substrate 11, and a p-well is formed in the first well region between the third well regions. In the second well region, a p-well is formed in the second conductive type first dopant region 15. In this embodiment, the semiconductor substrate 11 is a p-type silicon substrate; however, an n-type silicon substrate may be used for the same purpose, in which case each well is formed to be of contrary constitution to the arrangements of FIG. 2E.

In the above-described procedure, a threshold voltage adjusting ion implantation process will be further performed after the p-well and n-well ion implantation processes using the medium and low energies using the p-well and n-well as a mask.

So far, the LOCOS method using the nitride film has been described. An ion implantation process may be performed for forming wells without removing the nitride film in case of using another device isolation technique, for example, a polysilicon sidewall locos (PSL).

The anti-oxidation film is partially overlapped with the edge portions of the field oxidation film, so that it is possible to position the dopant at the edge portions of the field oxidation film.

As described above, in the method for forming a triple well of the semiconductor device according to the present invention, since it is possible to make the dopant, which is inserted by the ion implantation in a state that the anti-oxidation film is present, be positioned closer to the bottom and edge portions of the field oxidation film, it is possible to effectively improve the device isolation and latch-up characteristics.

In addition, the present invention has advantages in that the fabrication process is made simpler by reducing the necessary number of oxidation film growth and removal processes by one time, respectively. Moreover, it is possible to reduce the thickness of the photoresist film which is used as a mask by performing the high energy ion implantation process without removing the anti-oxidation film.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A method for forming a triple well of a semiconductor, comprising the steps of:

preparing a first conductive type semiconductor substrate having an active region and a field region;

forming a buffer film on the active region of the substrate and forming an anti-oxidation film on the buffer film;

forming a field oxidation film on the field region;

forming a second conductive type first dopant region in the substrate by implanting first ions through the field oxidation film and the anti-oxidation film;

forming a first conductive type first dopant region by implanting second ions in a first well region of the substrate;

forming a first conductive type second dopant region by implanting third ions in a second well region of the substrate spaced apart from the first well region; and forming a second conductive type second dopant region by implanting fourth ions in a third well region of the substrate between the first well region and the second well region.

2. The method of claim 1, wherein said third well region is an n-type well, said first well region between the third well regions is a p-type well, and said second well region is a p-type well formed in the first conductive type first dopant region.

3. The method of claim 1, wherein said first conductive type first dopant region of the first well region is formed at a depth of the second conductive type first dopant region in order for a bottom portion of the first conductive type first dopant region to be electrically connected to the first conductive type substrate.

4. The method of claim 1, wherein said first conductive type second dopant region is sequentially formed through successive ion implantation processes of medium and low energies.

5. The method of claim 1, wherein said second conductive type second dopant region is sequentially formed through successive ion implantation processes at medium and low energies.

6. The method of claim 1, wherein said anti-oxidation film is partially overlapped with an upper surface of the field oxidation film.

7. The method of claim 1, wherein said semiconductor substrate is a p-type silicon substrate.

8. The method of claim 1, wherein after formation of the third well region, a threshold voltage adjusting ion implantation process is further performed.

* * * * *